(12) United States Patent
Nakamura et al.

(10) Patent No.: US 8,369,802 B2
(45) Date of Patent: Feb. 5, 2013

(54) POLAR MODULATION TRANSMISSION APPARATUS AND POLAR MODULATION TRANSMISSION METHOD

(75) Inventors: Maki Nakamura, Osaka (JP); Kaoru Ishida, Osaka (JP)

(73) Assignee: Panasonic Corporation, Osaka (JP)

( * ) Notice: Subject to any disclaimer, the term of this patent is extended or adjusted under 35 U.S.C. 154(b) by 378 days.

(21) Appl. No.: 12/421,423

(22) Filed: Apr. 9, 2009

(65) Prior Publication Data

US 2009/0258611 A1 Oct. 15, 2009

(30) Foreign Application Priority Data

Apr. 10, 2008 (JP) ................................. 2008-102799
Jan. 27, 2009 (JP) ................................. 2009-015330

(51) Int. Cl.
*H04B 1/02* (2006.01)
(52) U.S. Cl. ..................................... 455/108; 455/114.3
(58) Field of Classification Search .................. 455/108, 455/114.3
See application file for complete search history.

(56) References Cited

U.S. PATENT DOCUMENTS

| 6,043,707 | A   * | 3/2000  | Budnik ........................... 330/10    |
| 6,272,125 | B1    | 8/2001  | Nomura                                        |
| 6,744,314 | B2  * | 6/2004  | Zhang et al. ................... 330/149     |
| 6,798,843 | B1  * | 9/2004  | Wright et al. .................. 375/296     |
| 7,193,459 | B1  * | 3/2007  | Epperson et al. .............. 330/130       |
| 7,363,014 | B2  * | 4/2008  | Nakamura et al. ......... 455/127.3          |
| 7,515,885 | B2  * | 4/2009  | Sander et al. ............. 455/127.3        |
| 7,684,514 | B2  * | 3/2010  | Saito et al. ................... 375/297     |
| 7,688,156 | B2  * | 3/2010  | Matsuura et al. ............. 332/145        |
| 7,782,133 | B2  * | 8/2010  | Bakalski et al. .............. 330/133       |
| 7,792,214 | B2  * | 9/2010  | Matsuura et al. ............. 375/297        |
| 7,830,220 | B2  * | 11/2010 | Ceylan et al. ................. 332/145      |
| 2005/0118965 | A1 * | 6/2005 | Tanabe et al. .............. 455/127.1       |
| 2005/0208907 | A1 * | 9/2005 | Yamazaki et al. ............ 455/126         |
| 2006/0226903 | A1 * | 10/2006 | Muller et al. ................. 330/149     |
| 2007/0014382 | A1 * | 1/2007 | Shakeshaft et al. ........... 375/297        |
| 2008/0180169 | A1 * | 7/2008 | Ripley et al. ................. 330/133      |
| 2009/0068966 | A1 * | 3/2009 | Drogi et al. ................. 455/127.1     |
| 2010/0189193 | A1 * | 7/2010 | Miura ........................... 375/308    |
| 2010/0222015 | A1 * | 9/2010 | Shimizu et al. .............. 455/102        |

FOREIGN PATENT DOCUMENTS

| JP | 09036677 A | * | 2/1997 |
| JP | 11-027233  |   | 1/1999 |
| JP | 2000-201088 |  | 7/2000 |
| JP | 2007-180782 |  | 7/2007 |

* cited by examiner

*Primary Examiner* — Thomas J Hiltunen
(74) *Attorney, Agent, or Firm* — Dickinson Wright PLLC

(57) ABSTRACT

The polar modulation apparatus of the present invention can control the output power of a transmission signal over a wide range and compensate characteristic degradation reliably upon temperature change. Polar modulation transmission apparatus 100 is provided with: temperature sensor 120; temperature compensation section 160-1 that corrects an amplitude signal and performs temperature compensation for transmission power amplification section 190; temperature compensation section 160-2 that corrects a power amplification signal and performs temperature compensation for power adjustment section 180; and correction value setting section 130 that sets correction values for temperature compensation section 160-1 and temperature compensation section 160-2, and, while only the amplitude signal is corrected according to a measurement result in temperature sensor 120 in the first mode, the amplitude signal and the power adjustment signal are corrected according to a measurement result in the second mode.

9 Claims, 12 Drawing Sheets

| OUTPUT POWER dBm | TEMPERATURE INFORMATION °C | CORRECTION VALUE mV |
|---|---|---|
| EQUAL TO OR HIGHER THAN 6 dBm (FIRST MODE) | 85 | 30.0 |
| | : | : |
| | 25 | 0.0 |
| | : | : |
| | -25 | -25.0 |
| LOWER THAN 6 dBm (SECOND MODE) | 85 | 60.0 |
| | : | : |
| | 25 | 0.0 |
| | : | : |
| | -25 | -50.0 |

FIG.7

| OUTPUT POWER dBm | TEMPERATURE INFORMATION °C | CORRECTION VALUE mV |
|---|---|---|
| EQUAL TO OR HIGHER THAN 6 dBm (FIRST MODE) | 85 | 0 |
| | ⋮ | ⋮ |
| | 25 | 0 (NO COMPENSATION) |
| | ⋮ | ⋮ |
| | -25 | 0 |
| LOWER THAN 6 dBm (SECOND MODE) | 85 | 30.0 |
| | ⋮ | ⋮ |
| | 25 | 0.0 |
| | ⋮ | ⋮ |
| | -25 | -25.0 |

FIG.8

| OUTPUT POWER dBm | TEMPERATURE INFORMATION °C | CORRECTION VALUE mV |
|---|---|---|
| 24 dBm | 85 | 30.0 |
| | : | : |
| | 25 | 0.0 |
| | : | : |
| | -25 | -25.0 |
| 23 dBm | 85 | 31.0 |
| | : | : |
| | -25 | -26.0 |
| : | : | : |
| 6 dBm | 85 | 40.0 |
| | : | : |
| | -25 | -35.0 |
| 5 dBm | 85 | 41.0 |
| | : | : |
| | -25 | -36.0 |
| : | : | : |
| -50 dBm | 85 | 60.0 |
| | : | : |
| | -25 | -50.0 |

FIG.9

| OUTPUT POWER dBm | TEMPERATURE INFORMATION °C | CORRECTION VALUE mV |
|---|---|---|
| 24 dBm | 85 | 0.0 |
| | : | : |
| | 25 | 0.0 |
| | : | : |
| | -25 | 0.0 |
| 23 dBm | 85 | 0.0 |
| | : | : |
| | -25 | 0.0 |
| : | : | : |
| 6 dBm | 85 | 0.0 |
| | : | : |
| | -25 | 0.0 |
| 5 dBm | 85 | 41.0 |
| | : | : |
| | -25 | -36.0 |
| : | : | : |
| -50 dBm | 85 | 60.0 |
| | : | : |
| | -25 | -50.0 |

← NO COMPENSATION

FIG.10

POLAR MODULATION TRANSMISSION APPARATUS AND POLAR MODULATION TRANSMISSION METHOD

CROSS REFERENCE TO RELATED APPLICATIONS

The disclosures of Japanese Patent Application No. 2008-102799 filed on Apr. 10, 2008, and Japanese Patent Application No. 2009-15330 filed on Jan. 27, 2009, including the specifications, drawings and abstracts, are incorporated herein by reference in their entireties.

BACKGROUND OF THE INVENTION

1. Field of the Invention

The present invention specifically relates to a transmission apparatus and polar modulation method using a polar modulation scheme.

2. Description of the Related Art

Upon designing a transmission modulation apparatus in digital radio communication, high efficiency is generally required. However, for the high frequency power amplifier ("PA") having the largest power consumption in a transmission modulation apparatus, linear characteristics of little distortion are further required in addition to efficiency. For these requirements, a technique has been proposed that enables both efficiency and linearity in a transmission modulation apparatus by using a polar modulation scheme. With the polar modulation scheme, even when a high frequency power amplifier is utilized in a saturation region of high efficiency, an linear amplification is possible.

An outline of a polar modulation scheme will be explained. FIG. 1 is a block diagram showing a sample configuration of a transmission modulation apparatus employing a polar modulation scheme. Polar coordinate conversion section 11 divides a modulation signal into the amplitude signal representing the amplitude component (for example, $\sqrt{I^2+Q^2}$) and the high frequency phase modulation signal representing the phase component (for example, the angle formed by the modulation symbol and the I-axis). The amplitude signal is provided to the power supply voltage of transmission power amplification section 13 formed with a high frequency power amplifier. After the power of the high frequency modulation signal is adjusted in power adjustment section 12 (formed with, for example, a variable gain amplifier and variable gain attenuator) based on a power adjustment signal for controlling the power of the high frequency phase signal, the high frequency modulation signal is outputted to transmission power amplification section 13. Transmission power amplification section 13 amplifies the power of the high frequency phase modulation signal using the amplitude signal as the power supply voltage. Thus, while amplifying the high frequency phase modulation signal in a state where transmission power amplification section 13 is operated in a saturation region, by attaching the amplitude component to the high frequency phase modulation signal and generating a transmission signal based on fluctuation of the power supply voltage, it is possible to realize both high linearity and high efficiency at the same time.

Generally, in the case of taking into account the operation environment of a transmission modulation apparatus, when the ambient temperature changes, the characteristics of the high frequency power amplifier forming transmission power amplification section 13 fluctuate. For example, for a high frequency power amplifier formed with an HBT (Heterojunction Bipolar Transistor), a change in temperature makes the relationship fluctuate between the power supply voltage provided to the power supply voltage of the high frequency power amplifier and the output power. That is, even when the same power supply voltage is provided, output power fluctuates based on temperature. Due to this, linear characteristics of the high frequency power amplifier degrade, and, consequently, a problem arises that, for example, jamming signals to adjacent frequency bands are produced. Therefore, in response to such temperature change, adaptive temperature compensation needs to be performed.

Patent Document 1 (Japanese Patent Application Laid-Open No. 2007-130782) discloses a polar modulation transmission apparatus that implements temperature compensation. The polar modulation transmission apparatus of Patent Document 1 acquires temperature information by a temperature sensor and performs temperature compensation for the amplitude signal according to the temperature information. By this means, when the temperature changes, it is possible to compensate characteristic degradation due to fluctuation of a relationship between the power supply voltage and output power of a high frequency power amplifier.

By the way, radio communication schemes such as UMTS (Universal Mobile Telecommunication System) are demanded to control the output power of a transmission signal over a quite wide range.

However, studies are not sufficiently underway for a polar modulation transmission apparatus that can control the output power of a transmission signal over a wide range and suppress degradation of signal quality due to temperature change.

SUMMARY OF THE INVENTION

It is therefore an object of the present invention to provide a polar modulation transmission apparatus and polar modulation transmission method that can control the output power of a transmission signal over a wide range, and that can compensate characteristic degradation reliably upon temperature change.

The present invention provides a first mode to operate as a non-linear amplifier and a second mode to operate as a linear amplifier, and, by changing a temperature compensation method according to the mode, achieves the above-described object.

The polar modulation transmission apparatus of the present invention employs a configuration having: a power adjustment section that adjusts a power level of a high frequency phase modulation signal of a modulation signal based on a power adjustment signal; a transmission power amplification section that has a first mode for allowing an operation as a non-linear amplifier and a second mode for allowing an operation as a linear amplifier, and, using an amplitude signal of the modulation signal as a power supply voltage, amplifies the high frequency phase modulation signal and outputs a transmission signal; a temperature detection section that measures a temperature near the transmission power amplification section; a first temperature compensation section that corrects the amplitude signal and performs temperature compensation for the transmission power amplification section; and a second temperature compensation section that corrects the power adjustment signal and performs temperature compensation for the power adjustment section, and, where, in the first mode, only the first temperature compensation section performs temperature compensation according to a measurement result in the temperature detection section, and, in the second mode, the first temperature compensation section and the second temperature compensation section perform temperature compensation according to the measurement result in the temperature detection section.

The polar modulation transmission method of the present invention employs a configuration having the steps of: adjusting a power level of a high frequency phase modulation signal of a modulation signal based on a power adjustment signal; where a first mode allows an operation as a non-linear amplifier and a second mode allows an operation as a linear amplifier, amplifying the high frequency phase modulation signal and outputting a transmission signal using an amplitude signal of the modulation signal as a power supply voltage; measuring a temperature of a place from which the transmission power is outputted; correcting only the amplitude signal according to the measured temperature in the first mode; and correcting the amplitude signal and the power adjustment signal according to the measured temperature in the second mode.

BRIEF DESCRIPTION OF THE DRAWINGS

FIG. 7 illustrates an example of a temperature compensation table for a temperature compensation section;

FIG. 8 illustrates an example of a temperature compensation table for a temperature compensation section;

FIG. 9 illustrates another example of a temperature compensation table for a temperature compensation section;

FIG. 10 illustrates another example of a temperature compensation table for a temperature compensation section.

DETAILED DESCRIPTION OF THE PREFERRED EMBODIMENT

An Embodiment of the present invention will be explained below in detail with reference to the accompanying drawings.
(Embodiment)

Figure 1:
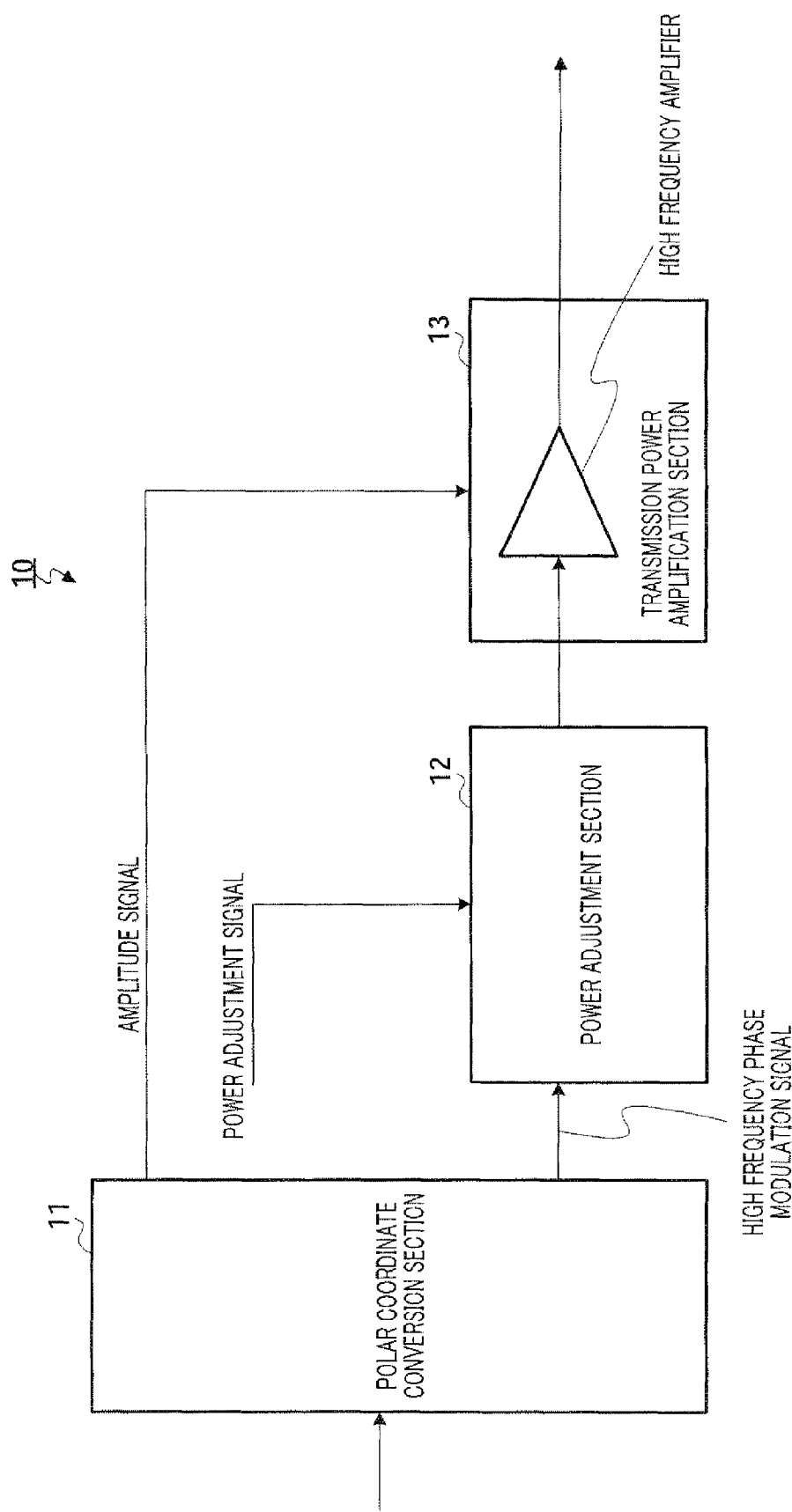
FIG. 1 is a block diagram showing main components of a conventional polar modulation transmission apparatus.
Figure 2:
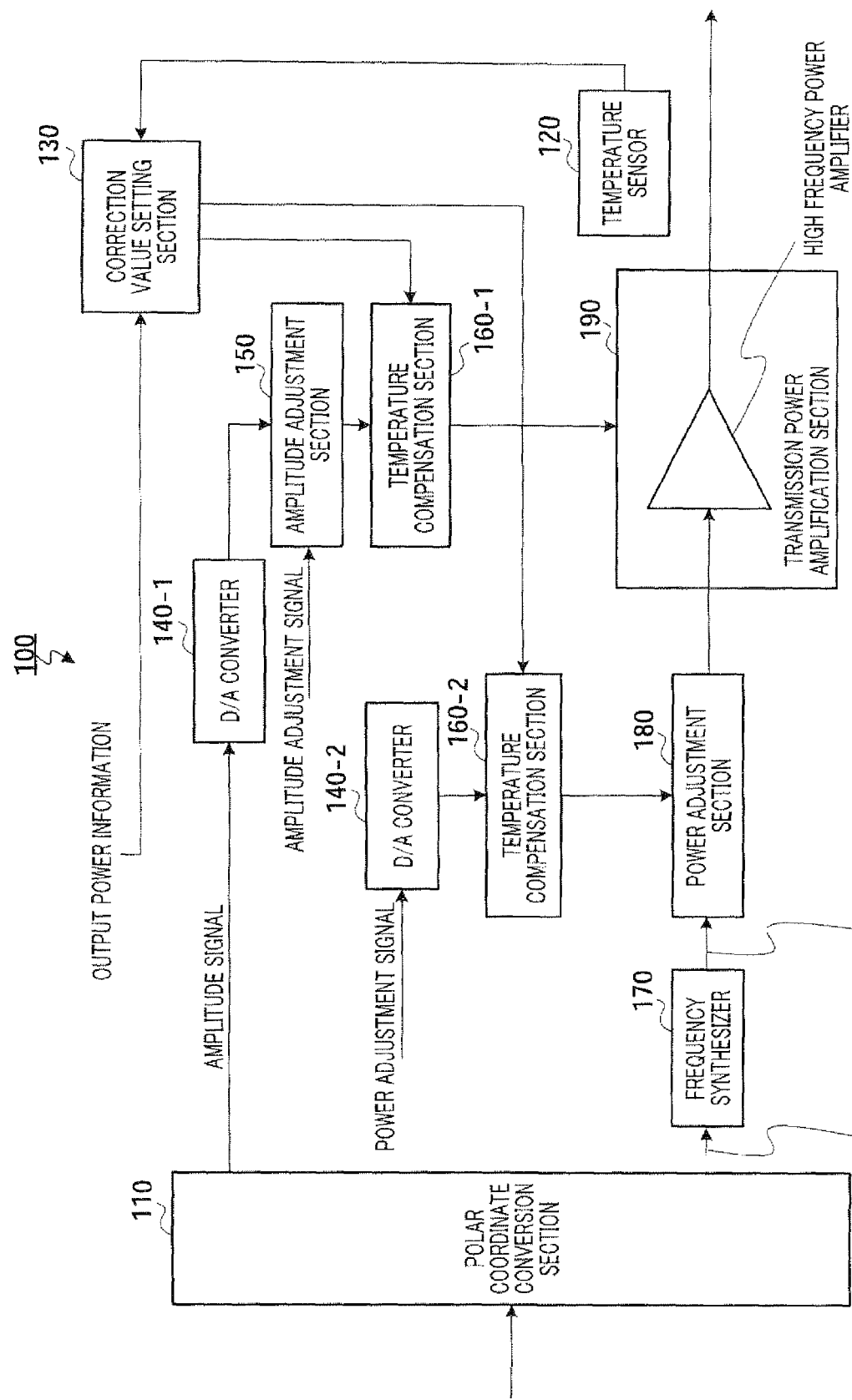
FIG. 2 is a block diagram showing main components of a polar modulation transmission apparatus according to an Embodiment of the present invention.

FIG. 2 illustrates main components of the polar modulation transmission apparatus according to an Embodiment of the present invention. Polar modulation transmission apparatus 100 in FIG. 2 is provided with polar coordinate conversion section 110, temperature sensor 120, correction value setting section 130, D/A (Digital to Analog) converters 140-1 and 140-2, amplitude adjustment section 150, temperature compensation sections 160-1 and 160-2, frequency synthesizer 170, power adjustment section 180 and transmission power amplification section 190.

Polar coordinate conversion section 110 generates an amplitude signal and a phase signal from a modulation signal received as input. To be more specific, polar coordinate conversion section 110 generates an envelope component signal including amplitude information of the modulation signal (i.e., amplitude signal) and a phase signal including phase information of the modulation signal. Polar coordinate conversion section 110 outputs the amplitude signal to amplitude adjustment section 150 via D/A converter 140-1. Further, polar coordinate conversion section 110 outputs the phase signal to frequency synthesizer 170.

Temperature sensor 120 measures a temperature near transmission power amplification section 190 and outputs the measurement result to correction value setting section 130.

Correction value setting section 130 sets the correction values used in temperature compensation sections 160-1 and 160-2, based on the measurement result of the temperature measured by temperature sensor 120 and information about required output power of a transmission signal (output power information), and controls temperature compensation sections 160-1 and 160-2. Further, a setting and control method of a correction value will be described later.

D/A converter 140-1 performs digital-to-analog conversion (D/A conversion) of the amplitude signal and outputs the amplitude signal after D/A conversion to amplitude adjustment section 150. Further, D/A converter 140-2 performs D/A conversion of a power adjustment signal and outputs the power adjustment signal after D/A conversion to temperature compensation section 160-2.

Further, in FIG. 2, temperature compensation sections 160-1 and 160-2, which will be described later, are formed with analog circuits, and, consequently, D/A converters 140-1 and 140-2 are provided before temperature compensation sections 160-1 and 160-2, respectively. Therefore, if temperature compensation sections 160-1 and 160-2 are formed with digital circuits, it is preferable to provide D/A converter 140-1 between temperature compensation section 160-1 and transmission power amplification section 190, and provide D/A converter 140-2 between temperature compensation section 160-2 and power adjustment section 180.

Amplitude adjustment section 150 adjusts the amplitude level of the amplitude signal outputted from D/A converter 140-1, according to an amplitude adjustment signal. An amplitude adjustment signal is a signal for adjusting the amplitude level of the amplitude signal according to the required output power of the transmission signal. Amplitude adjustment section 150 is formed with, for example, a multiplier. Amplitude adjustment section 150 outputs the amplitude signal after adjustment to temperature compensation section 160-1.

Temperature compensation section 160-1 performs temperature compensation for transmission power amplification section 190 by correcting the amplitude signal. Temperature compensation section 160-1 corrects the amplitude signal based on the correction value outputted from correction value setting section 130 and provides the amplitude signal after correction to the power supply of transmission power amplification section 190. Further, the method of temperature compensation in temperature compensation section 160-1 will be described later in detail.

Temperature compensation section 160-2 performs temperature compensation for power adjustment section 180 by correcting the power adjustment signal. A power adjustment signal is a signal for adjusting the power of a high frequency phase modulation signal that is outputted to transmission power amplification section 190, according to the required output power of the transmission signal. Temperature compensation section 160-2 corrects the power adjustment signal based on the correction value outputted from correction value setting section 130, and outputs the power adjustment signal after correction to power adjustment section 180 as the power supply voltage. Further, the method of temperature compensation in temperature compensation section 160-2 will be described later in detail.

Frequency synthesizer 170 generates a high frequency phase modulation signal of a constant envelope by modulating the phase of a carrier wave signal according to the phase modulation signal. Frequency synthesizer 170 outputs the high frequency phase modulation signal to power adjustment section 180.

Power adjustment section 180 adjusts the power level of the high frequency phase modulation signal of the modulation signal according to the power adjustment signal outputted from temperature correction section 160-2, and outputs the high frequency phase modulation signal after adjustment to transmission power amplification section 190. Power adjustment section 180 is formed with, for example, a variable gain amplifier ("VGA") and a variable gain attenuator ("ATT").

Figure 3A:
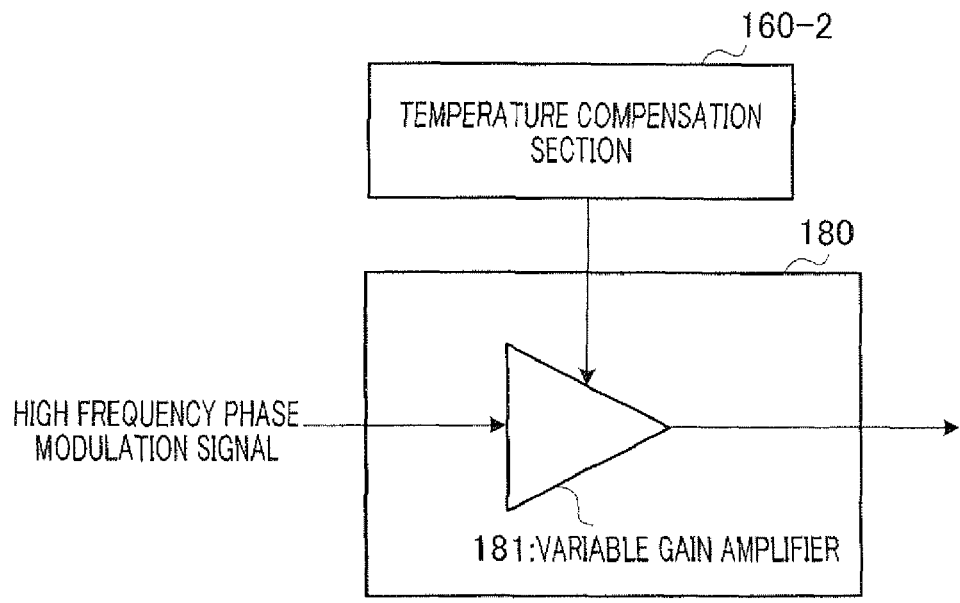
FIG. 3A is a block diagram showing a sample configuration inside a power adjustment section.
Figure 3B:
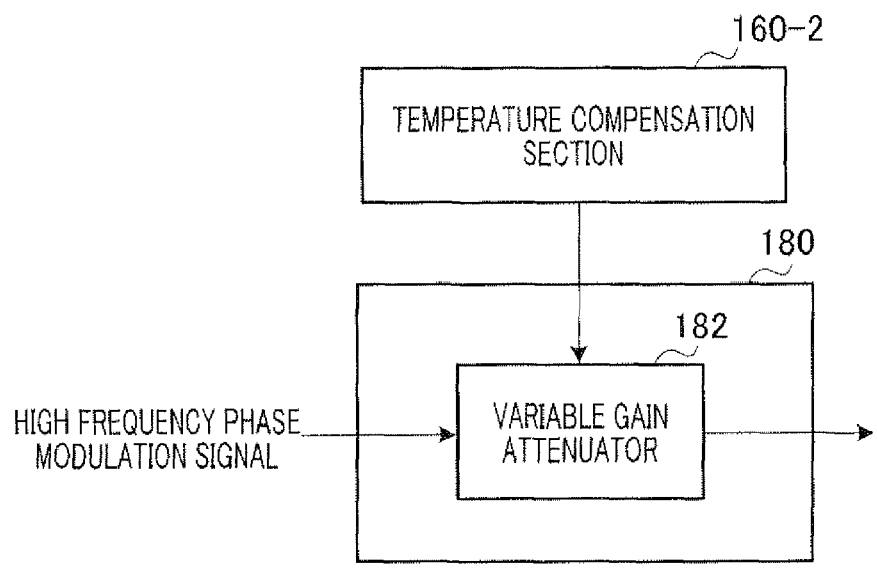
FIG. 3B is a block diagram showing a sample configuration inside a power adjustment section.

Further, power adjustment section 180 may employ a configuration having only one of a variable gain amplifier and an attenuator, or employ a configuration connecting a variable gain amplifier and an attenuator serially. FIG. 3A illustrates a sample configuration of power adjustment section 180 having only variable gain amplifier 181, and FIG. 3B illustrates a sample configuration of power adjustment section 180 having only variable gain attenuator 182. Further, as shown in FIG. 3C and FIG. 3D, by employing a configuration in which variable gain amplifier 181 and variable gain attenuator 182 are connected serially, it is possible to acquire a wider variable gain range than a configuration having only one of variable gain amplifier 181 and variable gain attenuator 182.

Figure 3C:
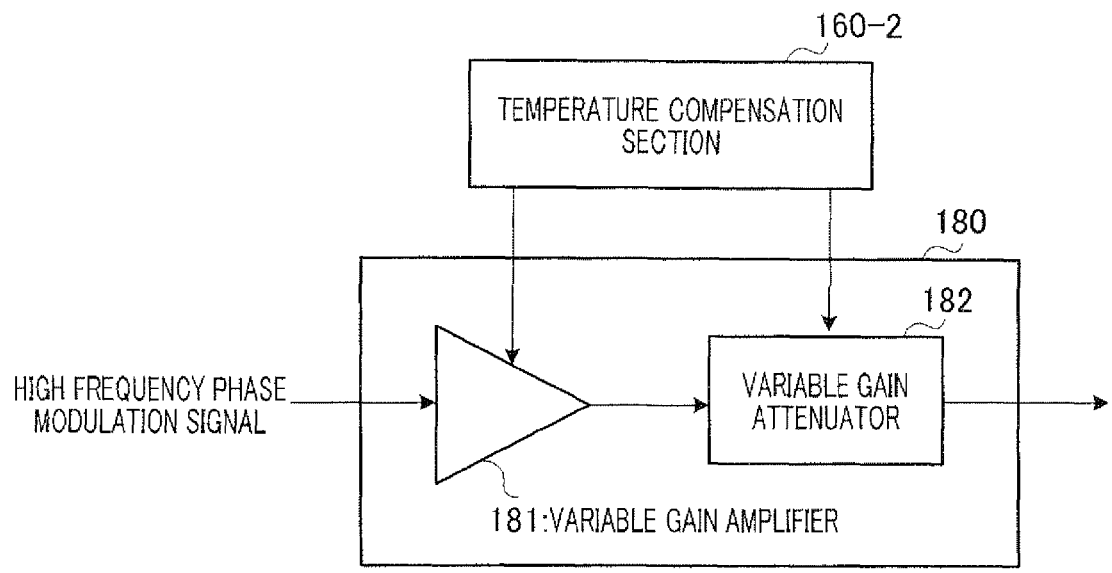
FIG. 3C is a block diagram showing a sample configuration inside a power adjustment section.
Figure 3D:
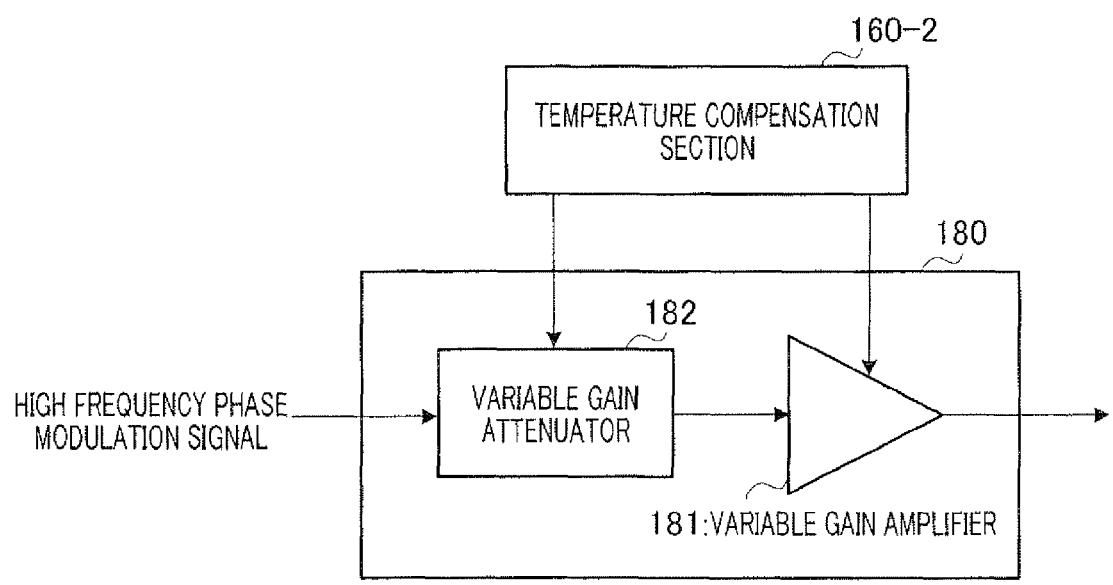
FIG. 3D is a block diagram showing a sample configuration inside a power adjustment section.

Further, when a variable gain amplifier and a variable gain attenuator are connected serially, as shown in FIG. 3C, if variable gain amplifier 181 and variable gain attenuator 182 are connected such that variable gain amplifier 181 is positioned in the earlier stage and variable gain attenuator 182 is positioned in the later stage, noise elements that are produced in variable gain amplifier 181 can be suppressed in variable gain attenuator 182, so that it is possible to suppress a noise in power adjustment section 180 in total. By contrast, as shown in FIG. 3D, if variable gain attenuator 182 and variable gain amplifier 181 are connected such that variable gain attenuator 182 is positioned in the earlier stage and variable gain amplifier 181 is positioned in the later stage, the output of variable gain amplifier 181 is not attenuated, so that it is possible to provide an advantage of decreasing the power level of a power adjustment signal that is outputted to the power supply voltage of variable gain amplifier 181 and increasing power efficiency in power adjustment section 180 in total. To realize low noise, as shown in FIG. 3C, it is particularly preferable to employ a configuration in which a variable gain amplifier is positioned in the earlier stage and a variable gain attenuator is positioned in the later stage. Further, if power adjustment section 180 has both variable gain amplifier 181 and variable gain attenuator 182, temperature compensation section 160-2 employs a configuration such that a power adjustment signal is outputted to variable gain amplifier 181 and variable gain attenuator 182.

Transmission power amplification section 190 uses as the power supply voltage the amplitude signal after correction outputted from temperature compensation section 160-1, and, according to the amplitude signal after correction, amplifies the high frequency phase modulation signal outputted from power adjustment section 180. Transmission power amplification section 190 is formed with, for example, a high frequency power amplifier.

Next, the operations of polar modulation transmission apparatus 100 employing the above-noted configuration will be explained. Polar modulation transmission apparatus 100 changes power control between two kinds of power control according to the output power of a transmission signal.

To be more specific, in a region in which the output power is relatively high, power control is performed by adjusting, in amplitude adjustment section 150, the level of the power supply voltage provided to the power supply of transmission power amplification section 190 while maintaining the level of the high frequency phase modulation signal that is inputted into transmission power amplification section 190. This control scheme will be referred to as the "first mode" below. In the first mode, it is possible to use transmission power amplification section 190 in the saturation region, so that high efficiency is possible. Thus, in the first mode, transmission power amplification section 190 performs non-linear operations.

By contrast with this, in a region in which the output power is relatively low, power control is performed by adjusting, in power adjustment section 180, the level of the high frequency phase modulation signal that is inputted into transmission power amplification section 190 while maintaining the level of the power supply voltage provided to the power supply of transmission power amplification section 190, that is, while maintaining the adjustment in amplitude adjustment section 150. This control method will be referred to as the "second mode", below. In the second mode, it is possible to use transmission power amplification section 190 in the linear region, so that power control is possible in a wide range. Thus, in the second mode, transmission power amplification section 190 performs linear operations.

Further, the first mode can be referred to as the "compressed mode" or "saturation operation mode," and the second mode can be referred to as the "uncompressed mode" or "non-saturation operation mode."

The first mode and second mode will be explained using FIG. 4 and FIG. 5.

Figure 4:
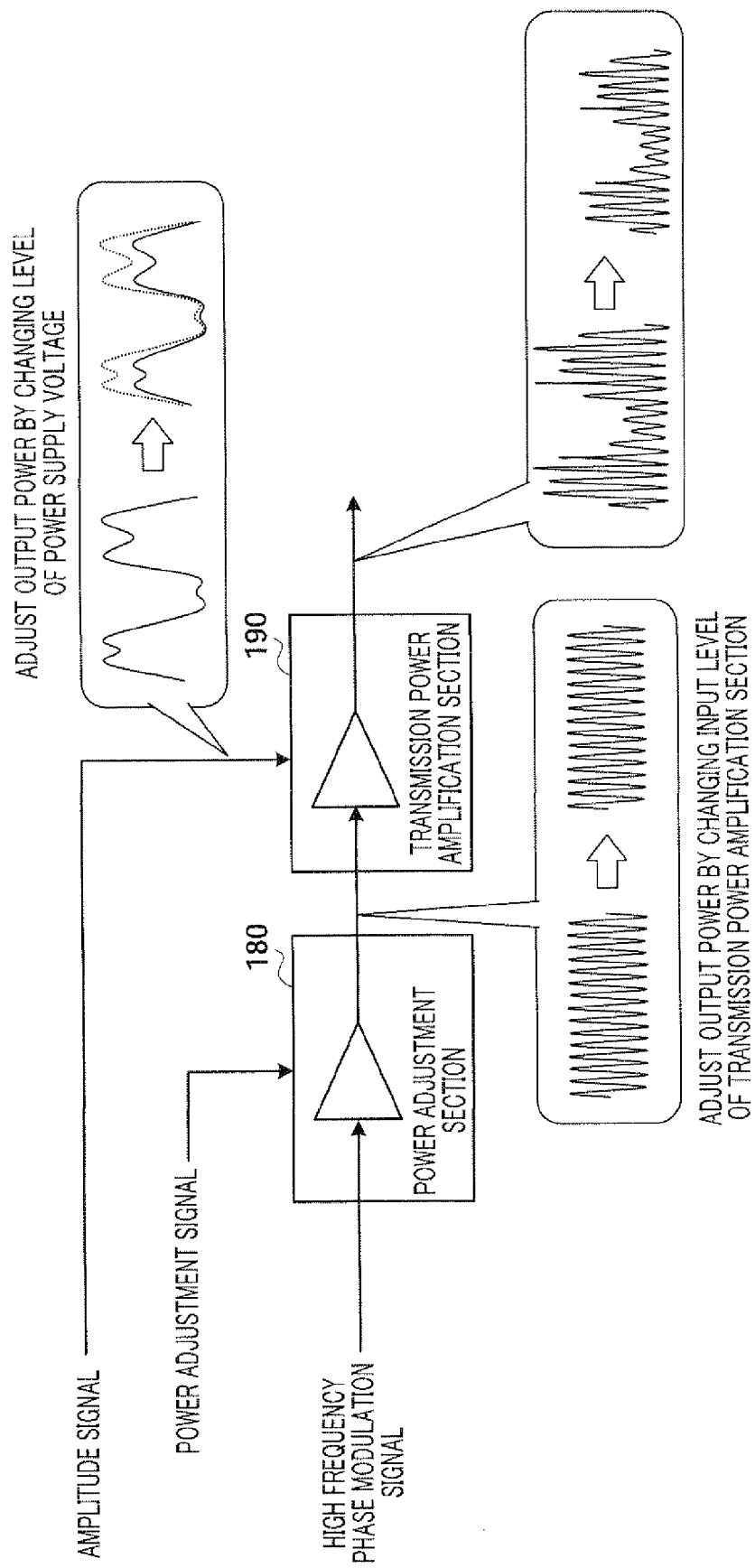
FIG. 4 illustrates a first mode.

In the first mode, as shown in FIG. 4, transmission power amplification section 190 is operated as a non-linear amplifier to amplify the high frequency phase modulation signal and control the average output level of a transmission signal based on the power supply voltage of transmission power amplification section 190. That is, in the first mode, a power adjustment signal is used to maintain the level of a high frequency phase signal that is inputted into transmission power amplification section 190. Further, in the first mode, to provide the required output power of a transmission signal, an amplitude adjustment signal is used to adjust the level of an amplitude signal that is provided to the power supply of transmission power amplification section 190. Thus, in the first mode, power control of a transmission signal is performed by adjusting the level of an amplitude signal that is provided to the power supply of transmission power amplification section 190 while maintaining the level of a high frequency phase modulation signal that is inputted into transmission power amplification section 190.

Figure 5:
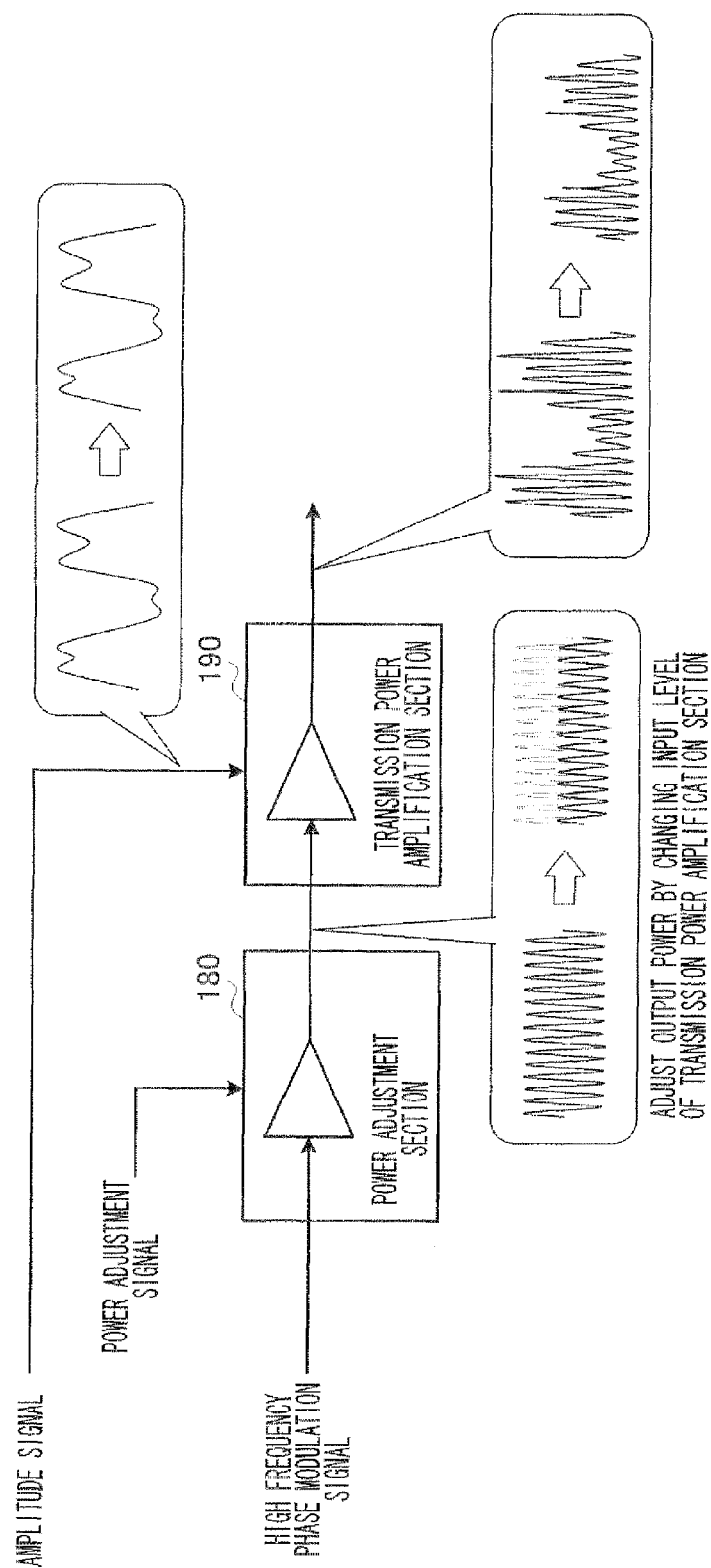
FIG. 5 illustrates a second mode.

In the second mode, as shown in FIG. 5, transmission power amplification section 190 is operated as a linear amplifier to control the average output level of a transmission signal in power adjustment section 180 before transmission power amplification section 190, and, based on the power supply voltage of transmission power amplification section 190, amplify the high frequency phase modulation signal. That is, in the second mode, an amplitude adjustment signal is used that can maintain the level of an amplitude signal that is provided to transmission power amplification section 190.

Further, in the second mode, to provide the required output power of a transmission signal, a power adjustment signal is used that can adjust the level of a high frequency phase modulation signal that is inputted into transmission power amplification section 190. Thus, in the second mode, power control of a transmission signal is performed by adjusting the level of a high frequency phase modulation signal that is inputted into transmission power amplification section 190 while maintaining the level of the power supply voltage that is provided to the power supply of transmission power amplification section 190.

The influence of temperature change is different between the first mode and the second mode. For example, in the first mode, although characteristic fluctuation is caused by the temperature of transmission power amplification section 190 itself, transmission power amplification section 190 is used in the saturation region, so that the sensitivity of the output level to fluctuation of the input level is insignificant and the influence of the temperature of power adjustment section 180 to the characteristic fluctuation is limited.

By contrast with this, in the second mode, characteristic fluctuation is caused by the temperature of transmission power amplification section 190 itself, and, since transmission power amplification section 190 is used in the linear region, the sensitivity of the output level to fluctuation of the input level is significant. Consequently, the influence of the temperature of power adjustment section 180 to the characteristic fluctuation is significant.

These are caused by difference of a way of receiving the influence by fluctuation of the input level between power control to operate transmission power amplification section 190 in the saturation region (ire., the first mode) and power control to operate transmission power amplification section 190 in the linear region (i.e., the second mode). That is, these are caused by, in the sufficient saturation region, little characteristic fluctuation of transmission power amplification section 190 caused by slight fluctuation of the input level, while, in the region in which transmission power amplification section 190 performs linear operations, if the input level fluctuates slightly, the output level also fluctuates and the characteristics fluctuate significantly.

The inventors of the present invention focus on this point. That is, in the first mode, the influence of characteristic fluctuation due to the temperature of power adjustment section 180 is limited, and, consequently, it is sufficient if temperature compensation is performed only for transmission power amplification section 190. By contrast, in the second mode, the influence of characteristic fluctuation due to the temperature of power adjustment section 180 is significant, and, consequently, possibility of improving signal quality by temperature compensation is considered high.

From these considerations, while temperature compensation is performed only for transmission power amplification section 190 in the first mode, temperature compensation is performed for both power adjustment section 180 and transmission power amplification section 190 in the second mode.

Correction value setting section 130 and temperature compensation sections 160-1 and 160-2 according to the present invention will be explained below.

Figure 6:
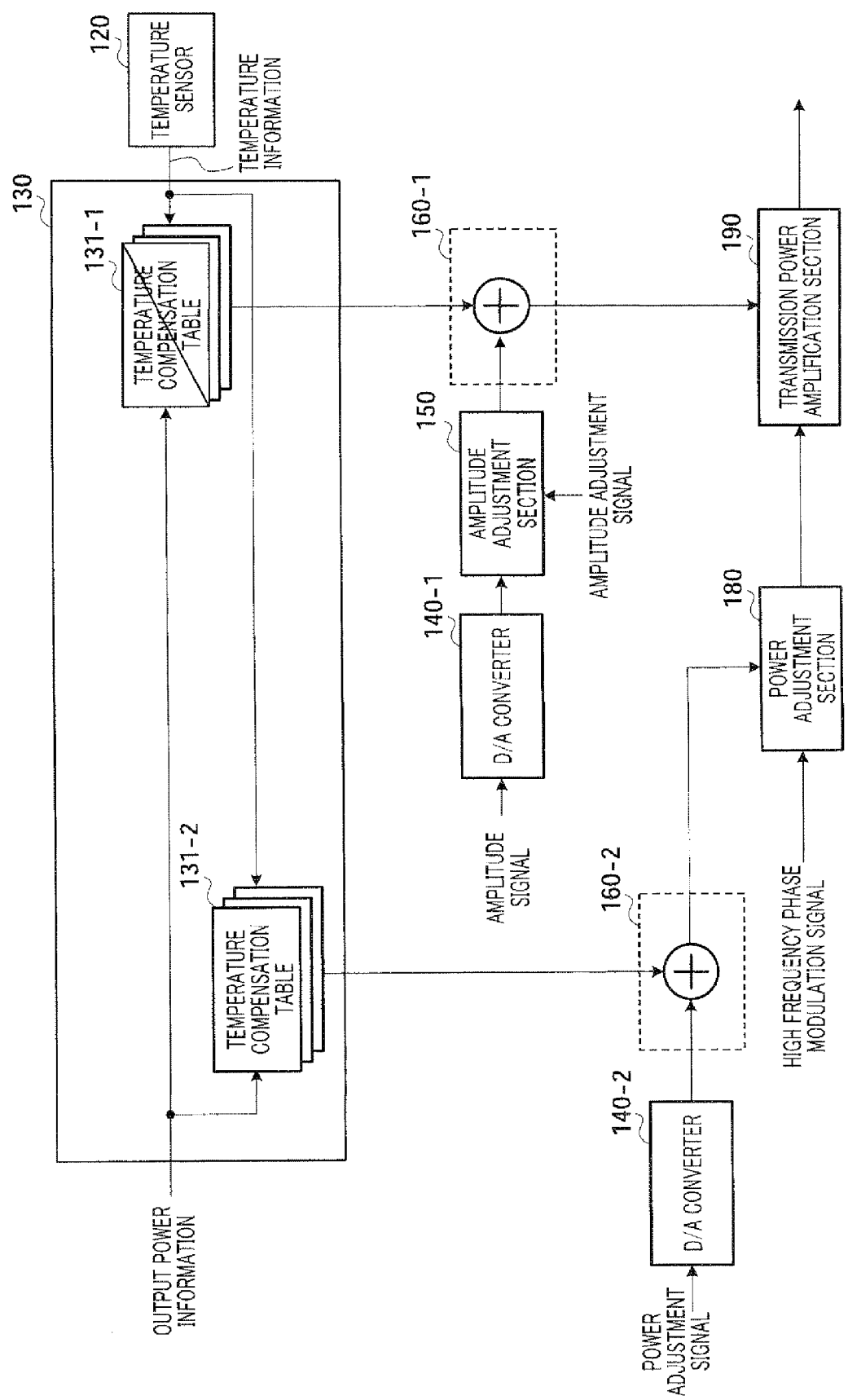
FIG. 6 illustrates a sample configuration inside a correction value setting section and temperature compensation section.

FIG. 6 illustrates a sample configuration inside correction value setting section 130 and temperature compensation sections 160-1 and 160-2.

Correction value setting section 130 in FIG. 6 includes, in correction value setting section 130, temperature compensation table 131-1 for temperature compensation section 160-1 and temperature compensation table 131-2 for temperature compensation section 160-2.

Polar modulation transmission apparatus 100 operates in the first mode or the second mode according to information (output power information) about the output power of a transmission signal. For example, when the output power is equal to or higher than a predetermined value (e.g., 6 dBm), polar modulation transmission apparatus 100 operates in the first mode. By contrast, when the output power is lower than a predetermined value (e.g., 6 dBm), polar modulation transmission apparatus 100 operates in the second mode.

In the first mode, correction value setting section 130 outputs correction value information M1 to temperature compensation section 160-1 using a measurement result in temperature sensor 120. Correction value information Ml is determined using temperature compensation table 131-1 held in correction value setting section 130. FIG. 7 illustrates an example of temperature compensation table 131-1 for temperature compensation section 160-1. Temperature compensation table 131-1 in FIG. 7 has different correction values between the first mode and the second mode.

Further, in the second mode, using a measurement result in temperature sensor 120, correction value setting section 130 outputs correction value information M1 to temperature compensation section 160-1 and outputs correction value information M2 to temperature compensation section 160-2. Similar to correction value information M1, correction value information M2 is determined using temperature table 131-2 held in correction value setting section 130. FIG. 8 illustrates an example of a temperature compensation table for temperature compensation section 160-2. Further, in FIG. 8, the correction values are 0's in the first mode because temperature compensation section 160-2 does not perform temperature compensation for power adjustment section 180 in the first mode.

In the first mode, the amplitude signal is corrected in temperature compensation section 160-1 according to correction value information M1. The correction is performed by, for example, adding the correction value to the amplitude signal or multiplying the amplitude signal by the correction value. The corrected amplitude signal is provided to the power supply voltage of transmission power amplification section 190, and the high frequency phase modulation signal is outputted to power adjustment section 180. Further, a power adjustment signal is outputted to temperature compensation section 160-2 and outputted as is to power adjustment section 180 without particular processing such as correction. Power adjustment section 180 adjusts the level of the high frequency phase modulation signal according to the power adjustment signal such that transmission power amplification section 190 performs saturation operations, and the adjusted high frequency phase modulation signal is outputted to transmission power amplification section 190. Transmission power amplification section 190 amplifies the high frequency phase modulation signal and controls the average output level using the adjusted amplitude signal as the power supply voltage.

In the second mode, an amplitude signal is corrected in temperature compensation section 160-1 according to correction value information M1. Similar to the first mode, the correction is performed by, for example, adding the correction value to the amplitude signal or multiplying the amplitude signal by the correction value. The corrected amplitude signal is inputted to the power supply voltage of transmission power amplification section 190, and a high frequency phase modulation signal is outputted to power adjustment section 180. Further, a power adjustment signal is corrected in temperature compensation section 160-2 according to correction value information M2. The correction is performed by, for example, adding the correction value to the amplitude signal or multiplying the amplitude signal by the correction value. The corrected power adjustment signal is outputted to power adjustment section 180. Power adjustment section 180 controls the average output level by adjusting the level of the high frequency phase modulation signal according to the adjusted power adjustment signal, and outputs the adjusted high frequency phase modulation signal to transmission power amplification section 190. Transmission power amplification section 190 amplifies the high frequency phase modulation signal using the corrected amplification component signal as the power supply voltage.

By this means, while enabling output power control over a wide range by choosing one of a linear operation and a non-linear operation in transmission power amplification section 190, it is possible to perform temperature compensation even when transmission power amplification section 190 performs linear operations and when transmission power amplification section 190 performs non-linear operations. Therefore, even when the power level of the high frequency phase modulation signal that is inputted into transmission power amplification section 190 fluctuates due to the temperature change in power adjustment section 180 before transmission power amplification section 190, temperature compensation can be performed for power adjustment section 180, so that it is possible to maintain quality of transmission signals good.

As described above, according to the present embodiment, polar modulation transmission apparatus 100 is provided with temperature sensor 120; temperature compensation section 160-1 that corrects an amplitude signal and performs temperature compensation for transmission power amplification section 190; temperature compensation section 160-2 that corrects a power adjustment signal and performs temperature compensation for power adjustment section 180; and correction value setting section 130 that sets the correction values of temperature compensation section 160-1 and temperature compensation section 160-2, and, while only the amplitude signal is corrected according to a measurement result in temperature sensor 120 in the first mode, the amplitude signal and the power adjustment signal are corrected according to a measurement result in the second mode. By this means, even when the level of the high frequency phase modulation signal that is inputted into transmission power amplification section 190 fluctuates due to temperature change, it is possible to compensate characteristic degradation upon temperature change.

Further, although a case has been described above with FIG. 7 and FIG. 8 where a temperature compensation table has temperature correction values when the output power is equal to or higher than a predetermined value (e.g., 6 dBm) or when the output power is lower than the predetermined value, the present invention is not limited to this. For example, as shown in FIG. 9 and FIG. 10, a temperature compensation table may include a plurality of output powers each having temperature correction values.

Further, although a case has been described above where correction value setting section 130 has temperature compensation tables, temperature compensation sections 160-1 and 160-2 may have a temperature compensation table to determine a correction value based on output power information and a measurement result in measurement sensor 120.

Further, although a case has been described above where temperature compensation sections 160-1 and 160-2 are formed with analog circuits, temperature compensation sections 160-1 and 160-2 may be formed with digital circuits and correction value setting section 130 may have digital compensation tables. Further, in this case, it may need to provide D/A converter 140-1 between temperature compensation section 160-1 and transmission power amplification section 190, and provide D/A converter 140-2 between temperature compensation section 160-2 and power adjustment section 180.

Further, power adjustment section 180 may be formed with a variable gain amplifier, variable gain attenuator or combination of the variable gain amplifier and the variable gain attenuator.

For example, power adjustment section 180 may have a variable gain amplifier, and, in the second mode, correction value setting section 130 may adjust the gain of the variable gain amplifier. By employing this configuration, in the second mode, it is possible to perform temperature correction for the variable gain amplifier.

Further, power adjustment section 180 may have an attenuator, and, in the second mode, correction value setting section 130 may adjust the amount of attenuation in the variable gain attenuator. By employing this configuration, in the second mode, it is possible to perform temperature correction for the variable gain attenuator.

Further, power adjustment section 180 may have a variable gain amplifier and a variable gain attenuator positioned after the variable gain amplifier, and, in the second mode, correction value setting section 130 may adjust the gain of the variable gain amplifier, the amount of attenuation in the variable gain attenuator or both. By employing this configuration, in the second mode, it is possible to perform temperature correction for the variable gain amplifier, the variable gain attenuator or both.

Further, power adjustment section 180 may have a variable gain attenuator and a variable gain amplifier provided after the variable gain attenuator, and, in the second mode, correction value setting section 130 may adjust the gain of the variable gain amplifier, the amount of attenuations in the variable gain attenuator or both. By employing this configuration, in the second mode, it is possible to perform temperature correction for the variable gain amplifier, the variable gain attenuator or both.

Further, although a case has been described above where correction value setting section 130 has temperature compensation tables 131-1 and 131-2 and determines a correction value based on temperature compensation tables 131-1 and 131-2, the present invention is not limited to this, and it is equally possible to determine a correction value using equations. A case will be explained below where a correction value is determined using equations.

Figure 11:
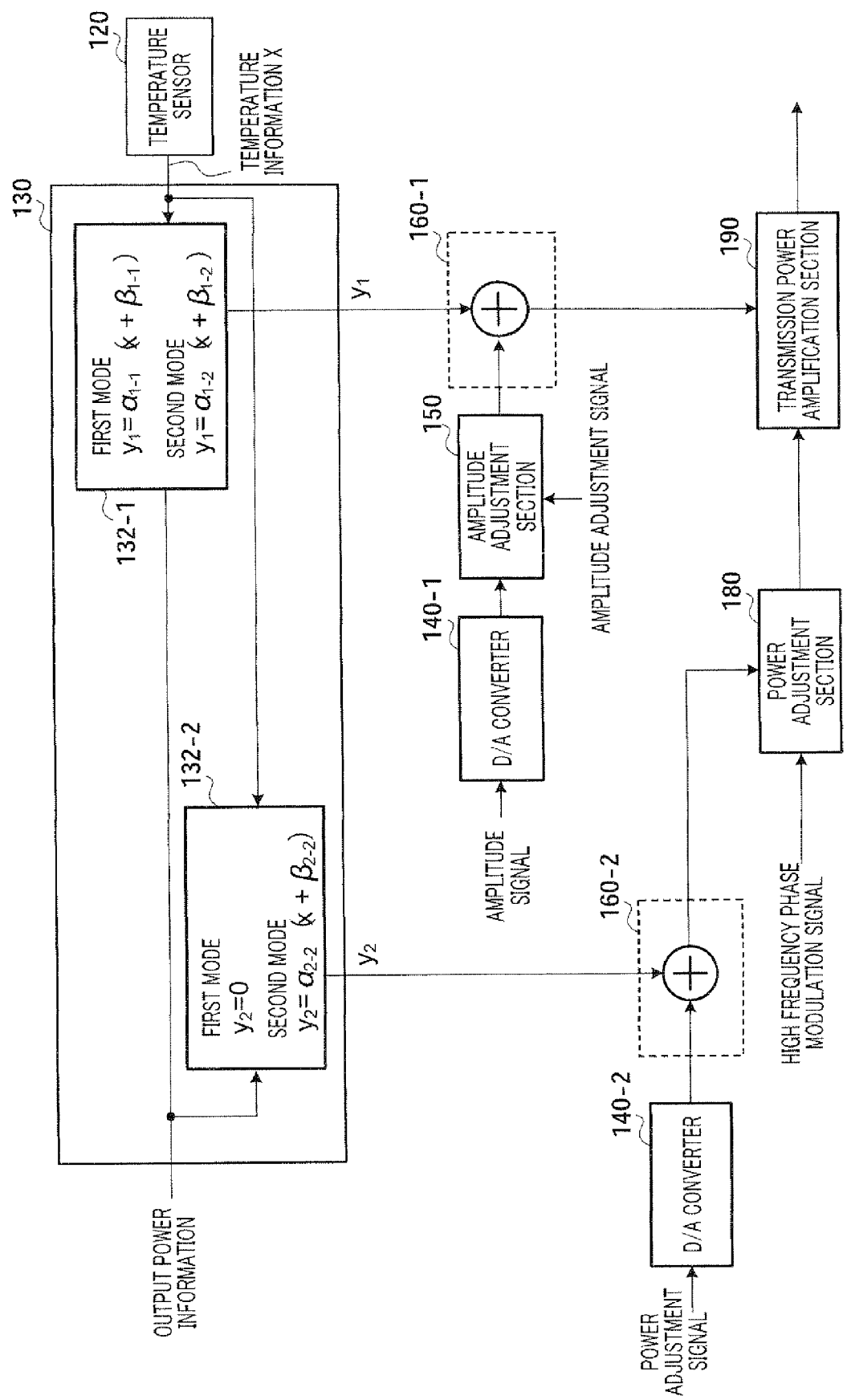
FIG. 11 illustrates another sample configuration inside a correction value setting section.

FIG. 11 illustrates a sample configuration of correction value setting section 130 that determines a correction value using equations, and correction value setting section 130 includes correction value calculation sections 132-1 and 132-2 instead of temperature compensation tables 131-1 and 131-2. Further, in FIG. 11, the same components as in FIG. 6 will be assigned the same reference numerals and explanation will be omitted.

Correction value calculation section 132-1 calculates temperature correction value $y_1$ in temperature compensation section 160-1. For example, temperature correction value $y_1$ is calculated using equation 1-1 in the first mode, and temperature correction value $Y_2$ is calculated using equation 1-2 in the second mode.

$$y_1 = \alpha_{1-1}(x + \beta_{1-1}) \qquad \text{(Equation 1-1)}$$

$$y_1 = \alpha_{1-2}(x + \beta_{1-2}) \qquad \text{(Equation 1-2)}$$

Here, x is the measurement result [deg] in temperature sensor 120, $\alpha_{1-2}$ and $\alpha_{1-2}$ are coefficients for determining temperature correction value $y_1$ used by temperature compensation section 160-1, and $\beta_{1-1}$ and $\beta_{1-2}$ are constants to make the temperature correction value $y_1$ 0 in a case of room temperature.

The calculated temperature correction value $y_1$ is outputted to temperature compensation section 160-1, and, for example, temperature compensation section 160-1 performs temperature compensation for transmission power amplification section 190 by adding the calculated temperature correction value $y_1$ to the amplitude signal.

Correction value calculation section 132-2 calculates temperature correction value $y_2$ in temperature compensation section 160-2. For example, correction value calculating section 132-2 makes temperature correction value $y_2$ 0 in the first mode as shown in equation 2-1, and calculates temperature correction value $y_2$ using equation 2-2 in the second mode.

$$y_2=0 \qquad \text{(Equation 2-1)}$$

$$y_2=\alpha_{2-2}(x+\beta_{2-2}) \qquad \text{(Equation 2-2)}$$

Here, x is the measurement result [deg] in temperature sensor 120, and, in the second mode, $\alpha_{2-2}$ is the coefficient for determining the temperature correction value $y_2$ used in temperature compensation section 160-2. In the second mode, $\beta_{2-2}$ is a constant to make the temperature correction value $y_2$ 0 in a case of room temperature.

The calculated temperature correction value $y_2$ is outputted to temperature compensation section 160-2, and, for example, temperature compensation section 160-2 performs temperature compensation for power adjustment section 180 by adding the temperature correction value $y_2$ to a power adjustment signal.

Although an exemplification of the preferred embodiment of the present invention has been described above, the scope of the present invention is not limited to this. The present invention can be implemented in various forms without departing from the scope of the invention.

The polar modulation transmission apparatus and polar modulation transmission method according to the present invention enable appropriate temperature compensation according to the mode, and, upon temperature change, can compensate characteristic degradation reliably. In particular, the polar modulation transmission apparatus and polar modulation transmission method according to the present invention are useful as a transmission apparatus and polar modulation transmission method using a polar modulation scheme.

What is claimed is:

1. A polar modulation transmission apparatus comprising:
a power adjustment section that adjusts a power level of a high frequency phase modulation signal of a modulation signal based on a power adjustment signal;
a transmission power amplification section that has a first mode which enables the transmission power amplification section to operate as a non-linear amplifier and a second mode which enables the transmission power amplification section to operate as a linear amplifier, and, using an amplitude signal of the modulation signal as a power supply voltage, amplifies the high frequency phase modulation signal and outputs a transmission signal;
a temperature detection section that measures a temperature near the transmission power amplification section;
a first temperature compensation section that corrects the amplitude signal and performs temperature compensation for the transmission power amplification section;
a second temperature compensation section that corrects the power adjustment signal and performs temperature compensation for the power adjustment section,
wherein, in the first mode, only the first temperature compensation section performs the temperature compensation according to a measurement result in the temperature detection section, and, in the second mode, the first temperature compensation section and the second temperature compensation section perform the temperature compensation according to the measurement result in the temperature detection section, and wherein the transmission power amplification section operates in the first mode when the power level is at least as great as a predetermined value, wherein, in the first mode, the power adjustment section adjusts an input level of the high frequency phase modulation signal to be input into the transmission power amplification section to a level at which the transmission power amplification section performs a saturation operation, and the transmission power amplification section operates in the second mode when the power level is less than the predetermined value, wherein, in the second mode, the power adjustment section adjusts the input level of the high frequency phase modulation signal to be input into the transmission power amplification section within a range in which the transmission power amplification section does not perform the saturation operation; and
a first correction value calculation section and a second correction value calculation section, wherein:
where x is the measurement result in the temperature detection section, $\alpha_{1-1}$ and $\alpha_{1-2}$ are coefficients for determining a temperature correction value $y_1$ used by the first temperature compensation section, and $\beta_{1-1}$ and $\beta_{1-2}$ are constants to make the temperature correction value $y_1$ equal to zero in a case of room temperature, the first correction value calculation section calculates the temperature correction value $y_1$ using Equation 1-1 in the first mode and using Equation 1-2 in the second mode, $$y_1=\alpha_{1-1}(x+\beta_{1-1}) \qquad \text{(Equation 1-1)}$$

$$y_1=\alpha_{1-2}(x+\beta_{1-2}) \qquad \text{(Equation 1-2)}$$

and the first temperature compensation section performs the temperature compensation for the transmission power amplification section by adding the calculated temperature correction value $y_1$ to the amplitude signal, and
where x is the measurement result in the temperature detection section, $\alpha_{2-2}$ is a coefficient for determining a temperature correction value $y_2$ used by the second temperature compensation section, and $\beta_{2-2}$ is a constant to make the temperature correction value $y_2$ equal to zero in a case of room temperature in the second mode, the second correction value calculation section calculates the temperature correction value $y_2$ using Equation 2-1 in the first mode and using Equation 2-2 in the second mode, $$y_2=0 \qquad \text{(Equation 2-1)}$$

$$y_2=\alpha_{2-2}(x+\beta_{2-2}) \qquad \text{(Equation 2-2)}$$

and the second temperature compensation section performs the temperature compensation for the power adjustment section by adding the temperature correction value $y_2$ to the power adjustment signal.

2. The polar modulation transmission apparatus according to claim 1, further comprising a correction value setting section that holds tables associating temperatures and correction values for the first mode and the second mode, and that determines a correction value for the amplitude signal and a correction value for the power adjustment signal with reference to the tables.

3. The polar modulation transmission apparatus according to claim 1, further comprising a correction value setting section that calculates a correction value for the amplitude signal and a correction value for the power adjustment signal using the measurement result in the temperature detection section.

4. The polar modulation transmission apparatus according to claim 1, wherein the power adjustment section comprises a variable gain amplifier as an element to adjust the power level of the high frequency phase modulation signal.

5. The polar modulation transmission apparatus according to claim 1, wherein the power adjustment section comprises a variable gain attenuator as an element to adjust the power level of the high frequency phase signal.

6. The polar modulation transmission apparatus according to claim 1, wherein the power adjustment section comprises a variable gain amplifier and a variable gain attenuator connected after the variable gain amplifier, as elements to adjust the power level of the high frequency phase modulation signal.

7. The polar modulation transmission apparatus according to claim 1, wherein the power adjustment section comprises a variable gain attenuator and a variable gain amplifier connected after the variable gain attenuator, as elements to adjust the power level of the high frequency phase modulation signal.

8. A polar modulation transmission method comprising:
adjusting, by a power adjustment section, a power level of a high frequency phase modulation signal of a modulation signal based on a power adjustment signal;
amplifying the high frequency phase modulation signal and outputting a transmission signal using an amplitude signal of the modulation signal as a power supply voltage, where the amplifying and the outputting are performed by a transmission power amplification section that has a first mode which enables the transmission power amplification section to operate as a non-linear amplifier and a second mode which enables the transmission power amplification section to operate as a linear amplifier;
measuring, by a temperature sensor, a temperature near the transmission power amplification section;
a first temperature correcting operation of correcting only the amplitude signal according to the measured temperature in the first mode; and
a second temperature correcting operation of correcting the amplitude signal and the power adjustment signal according to the measured temperature in the second mode, wherein:
the correcting of only the amplitude signal is performed when the power level is at least as great as a predetermined value in the first mode in which the power adjustment section adjusts an input level of the high frequency phase modulation signal to be input into the transmission power amplification section to a level in which the transmission power amplification section performs a saturation operation,
the correcting of the amplitude signal and the power adjustment signal is performed when the power level is less than the predetermined value in the second mode in which the power adjustment section adjusts the input level of the high frequency phase modulation signal to be input into the transmission power amplification section within a range in which the transmission power amplification section does not perform the saturation operation, and
the method includes a first correction value calculation operation and a second correction value calculation operation, wherein:
where x is the measurement result in the temperature sensor, $\alpha_{1-1}$ and $\alpha_{1-2}$ are coefficients for determining a temperature correction value $y_1$ used by the first temperature correcting operation, and $\beta_{1-1}$ and $\beta_{1-2}$ are constants to make the temperature correction value $y_1$ equal to zero in a case of room temperature, the first correction value calculation operation calculates the temperature correction value $y_1$ using Equation 1-1 in the first mode and using Equation 1-2 in the second mode, $$y_1 = \alpha_{1-1}(x + \beta_{1-1}) \quad \text{(Equation 1-1)}$$

$$y_1 = \alpha_{1-2}(x + \beta_{1-2}) \quad \text{(Equation 1-2)}$$

and the first temperature correcting operation performs the temperature compensation for the transmission power amplification section by adding the calculated temperature correction value $y_1$ to the amplitude signal, and
where x is the measurement result in the temperature sensor, $\alpha_{2-2}$ is a coefficient for determining a temperature correction value $y_2$ used by the second temperature correcting operation, and $\beta_{2-2}$ is a constant to make the temperature correction value $y_2$ equal to zero in a case of room temperature in the second mode, the second correction value operation section calculates the temperature correction value $y_2$ using Equation 2-1 in the first mode and using Equation 2-2 in the second mode, $$y_2 = 0 \quad \text{(Equation 2-1)}$$

$$y_2 = \alpha_{2-2}(x + \beta_{2-2}) \quad \text{(Equation 2-2)}$$

and the second temperature compensation correcting operation performs the temperature compensation for the power adjustment operation by adding the temperature correction value $y_2$ to the power adjustment signal.

9. The polar modulation transmission method according to claim 8, further comprising setting a correction value of the amplitude signal and a correction value of the power adjustment signal according to the measured temperature.

* * * * *